US007466586B2

(12) United States Patent  
Kim (10) Patent No.: US 7,466,586 B2  
(45) Date of Patent: Dec. 16, 2008

(54) DIODE-BASED CAPACITOR MEMORY AND ITS APPLICATIONS

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 363 days.

(21) Appl. No.: 11/306,756

(22) Filed: Jan. 10, 2006

(65) Prior Publication Data

US 2007/0133257 A1 Jun. 14, 2007

Related U.S. Application Data

(63) Continuation of application No. 11/164,919, filed on Dec. 11, 2005, now Pat. No. 7,196,926, and a continuation of application No. 11/164,872, filed on Dec. 8, 2005, now Pat. No. 7,209,384.

(51) Int. Cl.  
*G11C 11/36* (2006.01)

(52) U.S. Cl. ........................ 365/175; 365/105

(58) Field of Classification Search ............... 365/175, 365/49, 149, 105, 187  
See application file for complete search history.

(56) References Cited

U.S. PATENT DOCUMENTS

| | | | |
|---|---|---|---|
| 5,691,935 A * | 11/1997 | Douglass | 365/149 |
| 5,757,693 A * | 5/1998 | Houghton et al. | 365/149 |
| 6,104,045 A | 8/2000 | Forbes et al. | |
| 6,229,161 B1 | 5/2001 | Nemati et al. | |
| 6,331,947 B1 * | 12/2001 | Widdershoven et al. | 365/185.08 |
| 6,492,662 B2 | 12/2002 | Hsu et al. | |
| 6,773,968 B1 | 8/2004 | Forbes et al. | |
| 6,838,723 B2 | 1/2005 | Forbes | |
| 6,943,083 B2 | 9/2005 | Forbes | |
| 6,967,358 B2 | 11/2005 | Nemati et al. | |
| 7,078,739 B1 | 7/2006 | Nemati et al. | |
| 2003/0048655 A1 * | 3/2003 | El-Sharawy et al. | 365/149 |

FOREIGN PATENT DOCUMENTS

WO WO/2005/114742 12/2005

OTHER PUBLICATIONS

"A novel capacitor-less DRAM cell Thin Capacitively-Coupled Thyristor (TCCT)", 2005 IEEE Electron Devices Meeting (IEDM) Tech. Dig. pp. 311.

* cited by examiner

*Primary Examiner*—Anh Phung

(57) ABSTRACT

Diode-based capacitor memory uses relatively small capacitor, and uses a diode as an access device instead of MOS transistor, wherein the diode has four terminals, the first terminal is connected to a word line, the second terminal is connected to the first plate of capacitor which serves as a storage node, the third terminal is floating, the fourth terminal is connected to a bit line, wherein the capacitor is formed between the first plate and the second plate, and a plate line is connected to the second plate, during write the storage node is coupled or not, depending on the state of the diode by changing the plate line, during read the diode serves as a sense amplifier as well to detect the storage node voltage whether it is forward bias or not, in this manner the capacitor does not drive heavily loaded bit line directly, instead, it drives lightly loaded second terminal, and then the diode sends binary results to a data latch including a current mirror which repeats the amount of current that the memory cell flows, and the word line is de-asserted to cut off the holding current during standby, in addition its applications are extended to single port and content addressable memory. Furthermore, cell structures are devised on the bulk or SOI wafer.

13 Claims, 9 Drawing Sheets

Write "1"

Shockley Diode
(Hold "on/off" state)

FIG. 1A (Prior Art)

1T-1C DRAM

FIG. 6A (Prior Art)  FIG. 6B (The Invention)  FIG. 6C (The Invention)

Store "1"

FIG. 7A

Store "0"

FIG. 7B

Read 1

FIG. 8A

Read 0

T20 — Truth Table. 1

| sdata | nsdata | cdata | ncdata | Match line | Result |
|---|---|---|---|---|---|
| 0 | 0 | x | x | High | Match |
| 0 | 1 | 1 | 0 | Low | Mis-match |
| 0 | 1 | 0 | 1 | High | Match |
| 1 | 0 | 1 | 0 | High | Match |
| 1 | 0 | 0 | 1 | Low | Mis-match |

DIODE-BASED CAPACITOR MEMORY AND ITS APPLICATIONS

CROSS REFERENCE TO RELATED APPLICATION

The present invention is a continuation of application Ser. No. 11/164,919, filed Dec. 11, 2005, now U.S. Pat. No. 7,196,926, which is a continuation of application Ser. No. 11/164,872, filed Dec. 8, 2005, now U.S. Pat. No. 7,209,384, which are herein incorporated by reference.

FIELD OF THE INVENTION

The present invention relates generally to integrated circuits and in particular to RAM (Random Access Memory) and its applications, such as single-port memory and content addressable memory.

BACKGROUND OF THE INVENTION

A p-n-p-n diode known as Shockley diode or thyristor, is a solid-state semiconductor device similar to two-terminal p-n diode, with an extra terminal which is used to turn it on. Once turned on, diode (p-n-p-n diode or n-p-n-p diode) will remain on conducting state as long as there is a significant current flowing through it. If the current falls to zero, the device switches off. Diode has four layers, with each layer consisting of an alternately p-type or n-type material, for example p-n-p-n and n-p-n-p. The main terminals, labeled anode and cathode, are across the full four layers, and the control terminal, called the gate, is attached to one of the middle layers. The operation of a diode can be understood in terms of a pair of tightly coupled transistors, arranged to cause the self-latching action.

Diodes are mainly used where high currents and voltages are involved, and are often used to control alternating currents, where the change of polarity of the current causes the device to automatically switch off; referred to as 'zero cross operation'. The device can also be said to be in synchronous operation as, once the device is open, it conducts in phase with the voltage applied over its anode to cathode junction. This is not to be confused with symmetrical operation, as the output is unidirectional, flowing only from anode to cathode, and so is asymmetrical in nature.

These properties are used control the desired load regulation by adjusting the frequency of the trigger signal at the gate. The load regulation possible is broad as semiconductor based devices are capable of switching at extremely high speeds over extremely large numbers of switching cycles.

Figure 1A:
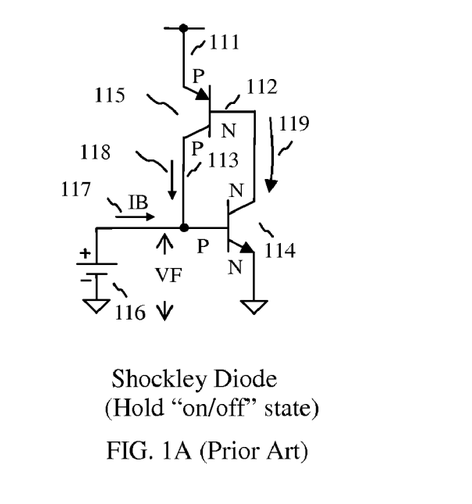
FIG. 1A illustrates a p-n-p-n diode as a prior art.

In FIG. 1A, the schematic of diode is illustrated. It consists of four terminals, such that the anode 111 is connected to power supply or regulating node, the base 112 of p-n-p transistor 115 serves as the collector 112 of n-p-n transistor 114, the collector 113 of p-n-p transistor 115 serves as the base of n-p-n transistor 114 which is controlled by the voltage controller 116. In order to turn on diode and hold the state of turn-on, the voltage controller should raise the voltage from ground level to VF (forward bias, 0.6 v~0.8 v for silicon). And the voltage controller 116 should supply the current 117, referred as the base current, which current depends on the characteristic of transistor 114 and 115. Once the base current 117 establishes the forward bias (VF), the collector 112 of n-p-n transistor 114 holds the current path 119 from the base of p-n-p transistor 115. After then, p-n-p transistor 115 is turned on because the base 112 has forward bias from the emitter 111. This makes the current path 118 which can keep the turn-on state. This is the holding state as long as the base has not so much leakage to drive the base voltage under forward bias (VF) even though the voltage controller 116 is open. To turn off diode, the voltage controller 116 should lower the voltage of the base of n-p-n transistor 114 under forward bias. To do so, the voltage controller 116 should flow more current than the current path 118.

Diode can hold the states of turn-on or turn-off, but it has very high holding current to store 'on' state. There are many prior arts to apply diode to a capacitive memory devices, such as, "High density planar SRAM cell using bipolar latch-up and gated diode breakdown", U.S. Pat. No. 6,104,045, and "Thyristor-type memory device" U.S. Pat. No. 6,967,358 and "Semiconductor capacitively-coupled negative differential resistance device and its applications in high-density high-speed memories and in power switches", U.S. Pat. No. 6,229,161. These prior arts require very high holding current and multiple internal voltage generators, in order to use a diode itself as a holding device which becomes a memory cell. And there is another report, "A novel capacitor-less DRAM cell Thin Capacitively-Coupled Thyristor (TCCT)", 2005 IEEE Electron Devices Meeting (IEDM) Tech. Dig. pp. 311. This approach requires very deep negative voltage in order to write data because the inversion layer of the gate is attached to the drain/source region (or emitter/collector), the gate can swing only ground to deep negative voltage (−1.5V) to avoid the leakage path to the drain, which needs negative pump circuit or external negative voltage. And high current flowing eventually raises operating temperature by "Joule heating", which produces more junction leakage and gate leakage. Consequently, the data stored in diode can be lost quickly by those leakages, which means that it is difficult to use diode itself as a memory device.

Another approach is that diode replaces the MOS access device as a switching element, not holding device. However diode can not easily replace the MOS device as an access device because it has unidirectional current control characteristic and internal feedback loop. Now the present invention devotes to replace MOS transistor with a diode as an access device and a control methodology has been invented to control the diode for memory operation. Diode can work for the memory devices as a switching element, not a storage element. Furthermore, diode can replace sense amplifier as well, such that diode output generates information "on" or "off" which is digital value. It gives us as many as advantages to design and fabricate it on the wafer.

Separately a capacitor is still required to store data as the conventional memories such as DRAM, but now there is no need of high capacitance to drive bit line directly. Instead, the capacitor drives only one of diode terminals which has very little capacitance, and the capacitor communicates to bit line (or data line) indirectly, while diode directly communicates to bit line. As a result, diode serves as a sense amplifier to detect whether the storage node voltage is forward bias or not. This is different control method from the conventional DRAM, where the gate of MOS transistor is connected to word line and turns on and off, but the load of gate is only gate and routing capacitance, while the storage capacitor drives the very heavy bit line directly, which means that word line loading is very light. Conversely, using diode as an access device gives bit line loading to word line through diode, which makes word line loading very heavy, but it is controllable to design with strong driver or segmentation for word line. Even though word line loading is high, it is desirable to configure a memory array because word line driver is stronger than the storage capacitor. In the conventional DRAM, the weak storage capacitor directly drives bit line, which needs time to redistribute charge from the capacitor to bit line. The stored charge was lost during read cycle by the charge redistribution, which is referred as destructive read. Memory read cycle was very slow because each read cycle requires additional restore procedure.

Furthermore, word line should be higher level than that of bit line to reduce threshold voltage drop by the access NMOS transistor. In case of PMOS access transistor, word line should be negative during read or restore. Those consume high switching current and pumping current. And MOS access transistor has subthreshold leakage current which is tricky and hard to reduce. In order to reduce subthreshold leakage current, the body of the MOS transistor is applied negative voltage for NMOS transistor, but the internal negative voltage generator consumes current and needs to be adjusted for the optimum voltage level for the use. And one more undesirable effect is the parasitic bipolar transistor in the bottom side of the MOS transistor which should be suppressed by applying the negative voltage to the body. The slight forward bias can remove the stored charge to the body.

Applying a diode as an access device, memory array design has a lot of freedom escaping from the MOS device. Additionally, the capacitor can be reduced, and any of capacitor can be used for storing data. Depending on the capacitor material, the retention time and the write time are different. For example, DRAM uses ordinary dielectric capacitor, such as silicon dioxide, silicon nitride, $Ta_2O_5$, $TiO_2$, $Al_2O_3$, TiN/$HfO_2$/TiN(TIT), and Ru/Insulator/TiN(RIT), which can store data in the range of 300 ms to 1 sec. It is called volatile memory. Alternatively, ferroelectric capacitor can be used as a storage capacitor, such as lead zirconate titanate (PZT), lead lanthanum zirconium titanate (PLZT), barium strontium titanate (BST), and strontium bismuth tantalate (SBT), as shown in the prior art, "Ferroelectric Random-Access Memory", U.S. Pat. No. 5,600,587. In the present invention, ferroelectric capacitor can be used as a volatile memory because the stored charges are gradually discharged after the electric field is off. Moreover read operation is different from FRAM (Ferroelectric Random Access Memory), such that plate line is not moving when read in the present invention, while plate line moves in FRAM operation in order to measure the polarized charges in the capacitor. Thus the memory operation is still volatile mode, but retention time would be increased as long as high dielectric constant material is used.

In the prior art, the storage capacitor directly drives the heavily loaded bit line through MOS transistor, which means that read operation depends on the charging time of the weak storage capacitor to heavy bit line parasitic capacitor. Also turn-on resistance of the MOS transistor is higher than that of diode. Thus discharging is slow with high RC time constant. These are major disadvantages of DRAM operation. Moreover read operation is destructive which requires the writeback operation. In consequence, DRAM operation is very slow.

Figure 1B:
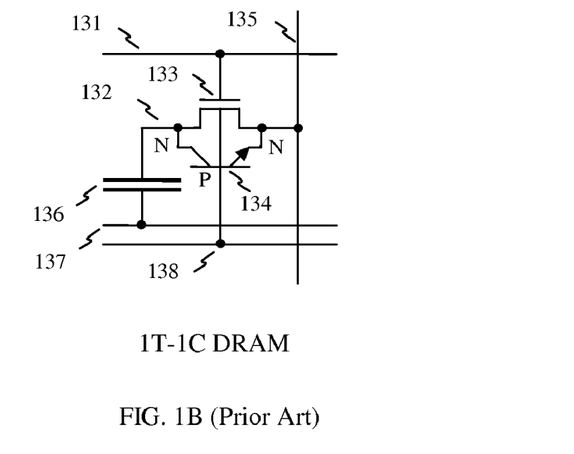
FIG. 1B depicts the schematic of 1T-1C based conventional DRAM as a prior art.

Still, there is a need in the art for a memory circuit and cell for random access memory devices, which realize low power, high density and simple structure to fabricate on the wafer. In the conventional MOS access transistor as shown in FIG. 1B, there is a parasitic n-p-n bipolar transistor wherein the body 134 serves as the base, source/drain serve as the emitter/collector. During read and write cycle, the base (body) 134 is at ground (or negative) to prevent bipolar effect. The parasitic bipolar transistor is not wanted device in the conventional memories which is usually turned off, but now adding one more terminal to the parasitic bipolar transistor in the conventional memory, a p-n-p-n diode (or n-p-n-p) can serve as four-terminal diode access device for the next generation memory devices with good performance and simple structure. Separately, storage capacitor is required to store data, but there is no need of high capacitance because the storage capacitor only drives the base of bipolar transistor while strong diode drives heavy bit line.

SUMMARY OF THE INVENTION

In the present invention, diode-based capacitor memory and its applications are described. The memory cell includes a storage capacitor and a p-n-p-n diode which combination is less complicated to fabricate, compared to fabricating complex MOS device. Replacing MOS access transistor with a diode as a switching device in the memory cell, there are as many as advantages to configure memory arrays, which can make us remove internal negative voltage generator, realize nondestructive read and simplify the memory cell structure with a few additional process steps. After storing data, word line is de-asserted to cut off the holding current, which reduces standby current dramatically. Diode need not be a high performance device nor have a high current gain, and diode can serve as a sense amplifier as well to detect the voltage of the storage node whether it is forward bias or not, then diode sends binary results to bit line. However the operation of diode is not as simple as that of MOS transistor because it has four terminals, internal feedback loop and unidirectional current control in nature even though it has almost no other side effects, except punch-through but it can be avoided to optimize the width of the base. In the present invention, the circuit methodology has been invented to use a diode as an access device which is very useful for realizing one diode and one capacitor memory.

Capacitor can be reduced because it does not drive bit line directly, while diode drives directly bit line. In doing so, any of capacitor can be used for the storage capacitor, such as silicon ordinary dielectric capacitor and ferroelectric capacitor. The stored data in the capacitor is periodically refreshed because the memory cell operates in volatile mode.

Removing MOS device from the memory cell, the cell structure is simplified and new types of cell structure can be formed, which can reduce cell area dramatically with no performance degradation.

With no internal negative voltage generator, standby and active power consumption are dramatically reduced.

And low power consumption suppresses junction leakage and capacitor oxide leakage. It is very helpful to store data for a long time in the storage node with low leakage, which can increase memory yield. Capacitor oxide leakage is minimized with low leakage material or thick oxide because the memory cell does not require high capacitance.

The present invention of memory can be implemented on the bulk or SOI wafer, which makes to integrate high density memory and control circuit on a chip.

Various types of diode can be applied to form the memory cell, such as silicon, germanium, GaAs, SiGe, and metal-semiconductor diode (Schottky diode), as long as the reverse bias current is controllable.

The memory operation is very fast and stable. Diode output can be transferred to bit line quickly, because diode current is generally much higher than that of MOS transistor. The diode generates current with its whole junction area while MOS transistor generates current with inversion layer on the surface. And non destructive read is realized, which need not restoring procedure and makes to reduce cycle time. Write operation has a sequence to clear data, that is, to turn-on diode before writing, which makes storage node to have the same starting voltage when writing. Without this sequence, the stored level depends on the previous data. When read, a data latch receives the binary data from the diode through bit line, wherein the data latch includes a current mirror which repeats the amount of current that the memory cell flows, in doing so, read operation is fast and reference bit line is not required by using current mirror.

Furthermore, the usage of the memory cell can be easily expanded as single port memory, and content addressable memory because of the simplicity to fabricate, small cell area, single or dual power supply, low power consumption, high speed operation and long retention time.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Detailed descriptions for the present invention are described as follows, which include the schematics, the timings and cross sectional views.

Figure 2A:
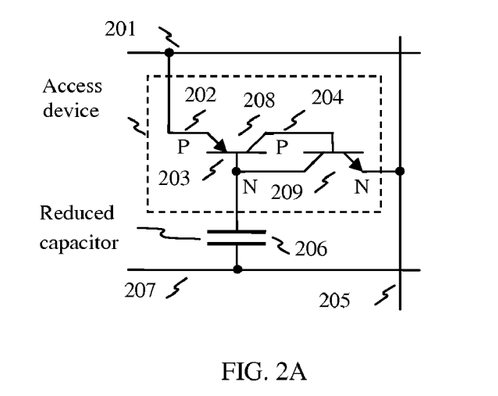
FIG. 2A depicts the schematic of the capacitor memory cell including a p-n-p-n diode and a capacitor for the present invention.

In FIG. 2A, diode-based capacitor memory is illustrated as the present invention. A p-n-p-n diode replaces MOS access transistor as an access device, wherein the equivalent schematic of the p-n-p-n diode is illustrated as two bipolar transistors, p-n-p transistor 208 and n-p-n transistor 209. The emitter 202 of p-n-p 208 serves as word line 201, the base 203 of p-n-p 208 serves as storage node of the capacitor 206, the collector 204 of p-n-p 208 serves as the base of n-p-n 209, the emitter of n-p-n 209 serves as bit line 205. There is a feedback loop wherein the collector 203 of n-p-n 209 serves as the base 203 of p-n-p 208 which serves as the storage node as well, and the collector 204 of p-n-p 208 serves as the base 204 of n-p-n 209, which feedback loop makes difficult to analyze it.

Now there is a circuit technique to simplify it. The base 203 of the storage node has high capacitance to sustain the storage node, but the base 204 of the n-p-n 209 has very little parasitic capacitance. In this sense, the storage node of the capacitor 206 which is the base 203 of p-n-p 208 can sustain the previous state for long time with the charges, but the base 204 of n-p-n 209 can not sustain the previous state because the connection between the base 204 and bit line 205 is forward bias and it has very little parasitic capacitance when bit line 205 is at ground level during pre-charge time, which forward bias makes the base 204 to lose the previous data quickly after word line 201 is deactivated to ground level for the pre-charge. This means that the collector 203 of n-p-n 209 has no current path through the emitter 205 of n-p-n 209 because the base 204 of n-p-n 209 (lost previous data) is near ground level and turns off the n-p-n 209 when word line 201 is de-asserted to ground level during pre-charge. Conversely, the storage capacitor 206 has enough charge to store the previous charge, because both the emitter 202 of p-n-p 208 and the collector 204 of p-n-p 208 are near ground level and reverse bias during standby. After then, word line 201 is asserted to high level to read or write, thus the capacitor 206 with the stored charge can control the base 203 of p-n-p 208 while n-p-n 209 is turned off. In this manner, the p-n-p 208 controls the collector 204 of n-p-n 209. Now n-p-n 209 is dependent element with no current path through the collector 203 of n-p-n 209 to the emitter 205. This gives an idea to replace n-p-n 209 with a p-n diode. In the present invention, a model of diode device is provided to be applied for capacitor memory.

Figure 2B:
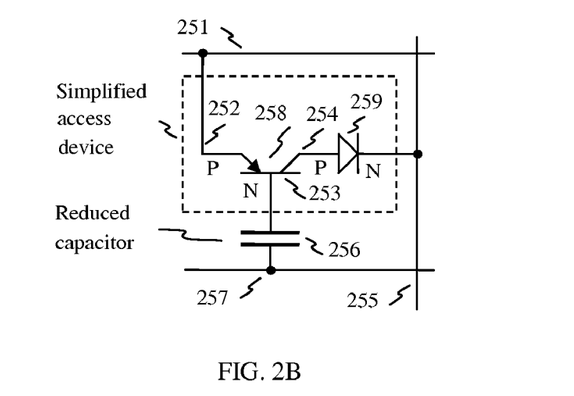
FIG. 2B illustrates the simplified schematic of diode-based capacitor memory for the present invention.

In FIG. 2B, the simplified model of diode-based capacitor memory is illustrated, wherein includes p-n-p bipolar transistor 258 and p-n diode 259. The emitter 252 of p-n-p 258 serves as word line 251, the base 253 of p-n-p 258 serves as a storage node of the capacitor 256, the collector 254 of p-n-p 258 serves as the anode of p-n diode 259, the cathode of p-n diode 259 serves as bit line 255. The p-n diode 259 effectively replaces n-p-n bipolar transistor, which p-n diode has important role to protect the unselected cell when bit line goes up to high level in order to write data "0". The p-n diode 259 is reverse bias and cuts off the current flow from bit line to the storage node. This simplified schematic is very useful to analyze as an access device of the memory cell. There is no feedback loop, and the current flow is only one direction from p-n-p bipolar transistor 258 to p-n diode 259. Furthermore, there are no tricky parasitic elements, while MOS access transistor has a parasitic bipolar transistor, the subthreshold leakage, and hot carrier effect, which are hidden.

Figure 3:
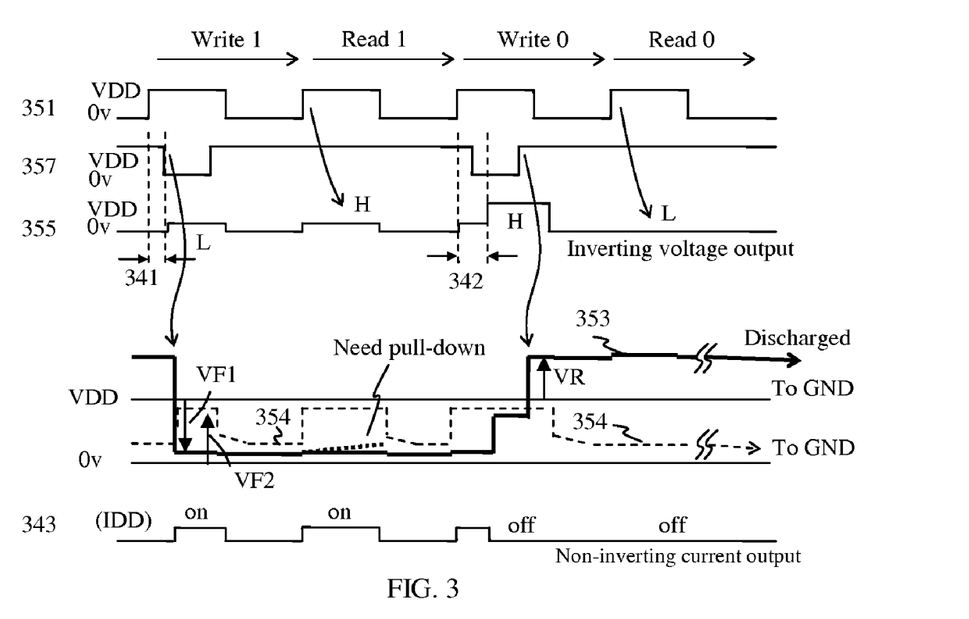
FIG. 3 illustrates write and read timing of diode-based capacitor memory shown in FIG. 2B.

Referring now FIG. 3 in view of FIG. 2B, write and read timing are illustrated for the memory cell of the present invention. Word line 351 stays at ground level during standby, and moves to high level when writing or reading as shown in 341. Bit line 355 stays at ground level during standby. Then bit line 355 determines to store data "1" (turn-on) or data "0" (turn-off). To prepare writing data '1' is to move word line 351 to high level, and then to lower plate line 357 to ground level from the predetermined positive level in order to couple the storage node and to turn on diode, while bit line 355 keeps ground level but it will go up slightly by turning on diode. Then the storage node 353 becomes forward bias (VF1) from word line which is at high level during write operation, and the floating node 354 (254 in FIG. 2B) which is the anode of diode (259 in FIG. 2B) becomes forward bias (VF2) toward bit line 355 which is at ground level to write data "1". Thus, the floating node 354 is raised by the p-n-p 358 which is turned on by lowering the plate line 357 or the stored charge 353 in the capacitor. The current path is set up from word line to bit line, after then the plate line 357 returns to high level to boost the storage node, but raising the plate line 357 to high level can not boost the storage node 353 because current flow is stronger than coupling. In doing so, the storage node 353 keeps forward bias and p-n-p-n diode is still turned-on. After the plate line 357 is returned to high level, word line 351 is returned to ground level, which cuts off the current path from word line to bit line during standby. As a result, there is no current path in the memory cell as shown in 343 in FIG. 3 during pre-charge (or standby), and the storage node keeps the potential that is reverse bias from word line and weak forward bias from floating node 354 which has ignorable leakage because the floating node 354 has very little charge. And the floating node will finally stay at ground level by the forward bias to bit line 355 which is at ground level.

After writing data "1", both word line and bit line are at ground level, which makes the storage node reverse bias, but reverse bias leakage helps to keep data "1" because it makes strong forward bias from word line 351 for the storage node 353 when word line moves to high level to read, and the floating node 354 quickly loses its charge by the forward bias from bit line which is at ground level, and it has very little parasitic capacitance as well, hence the p-n diode is always turned-off during standby. When read, if the storage node 353 (base 353 of the p-n-p transistor 358) is forward bias from word line 351, the p-n-p transistor 358 quickly raises the floating node 354, with the forward bias. Thus, p-n-p transistor 358 is turned on first, which turns on p-n diode (259 in FIG. 2B) by raising the floating node 354. Consequently the diode sets up the current flow to bit line 355. Bit line will be pulled up by the current flow. In this manner, data "1" does not need refresh cycle or no concern about losing data "1" during standby. However, data "1" can be lost when reading data '1', word line moves up and pulls up bit line during word line is high, if there is no pull-down device to sustain the current flow of the cell, the current moves up bit line (floating) until it will reach the critical voltage to be turned it off, which may cause failing to read data "1" for the next cycle because the storage node is pulled up near or higher than built-in voltage of p-n-p transistor 358. In order to avoid it, NMOS pull-down should be connected to bit line 355 and keeps turn-on state during read cycle. It realizes non destructive read which removes restoring procedure and reduces cycle time.

Still referring FIG. 3 in view of FIG. 2B, in order to write data "0", a timing clears the state of diode before writing in order to have the same stored level regardless of previous stored level. This sequence needs to turn-on diode first as shown 342 in FIG. 3. After turn-on diode, bit line 355 goes up to high level and turns off diode because word line 351 and bit line 355 are at the same high level, no current can flow between two terminals, which makes the storage node floating with no current path and ready to be coupled by the plate line 357. After settling bit line, the plate line 357 returns to high level which makes the plate line 357 to couple to the storage node 353 to higher level than that of word line. Stored voltage of data "0" is determined by the swing voltage of the plate line and the capacitance of storage node where the parasitic capacitance of the storage node is negligible. After then, storage node 353 will be discharged by the reverse bias leakage toward the adjacent nodes which stay at ground level during standby or unselected. Capacitor oxide leakage would be ignorable in most applications with thick oxide or low leakage insulator. The floating node 354 will be turned-off, after it quickly loses its charge by the forward bias toward bit line which is at ground level during standby, and it has very little parasitic capacitance and floating. The inverting voltage output is appeared in bit line 355 in FIG. 3 and non-inverting current output 343 is appeared in bit line. Refresh cycles are periodically asserted to sustain data "0" for DRAM application which operation includes to read voltage from the cell and restores inverting voltage data to the cell.

Figure 4:
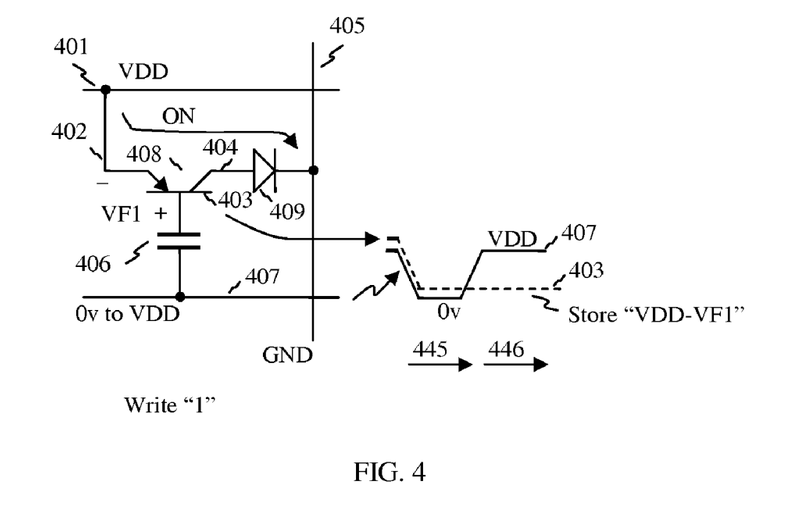
FIG. 4 illustrates the write path for data "1", according to the teachings of the present invention.

In FIG. 4A, more detailed write "1" operation is illustrated, wherein word line 401 is asserted to VDD (high level) while bit line 405 is at ground level. It makes to turn on diode by raising word line if the stored voltage is VDD−VF1 when the stored data is "1" because the forward bias is established from word line to the storage node 403. If the stored voltage is VDD+VR which is higher than that of word line when the stored data is "0", the storage node 403 is floating, thus the storage node 403 is coupled to lower than word line voltage, by lowering the plate line 407, wherein the coupling voltage is almost same as the swing voltage of the plate line 407 because the parasitic capacitance of the storage node is negligible. After the storage node is lowered, the forward bias is established from word line to the storage node, which sets up the current path. Either way can turn on the diode after plate line 407 is lowered to ground level. And after the current path is settled down, the plate line 407 returns to high level but the potential of the storage node 403 will not be changed by the coupling of plate line because the current flow is stronger than the capacitive coupling, which means that the voltage of storage node 403 is around VDD−VF1 after writing data "1", because the diode is turned on.

Figure 5:
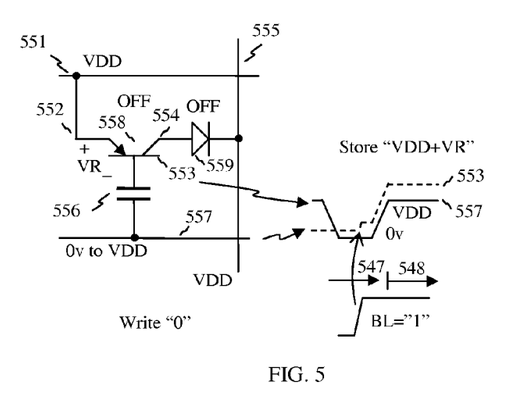
FIG. 5 illustrates the write path for data "0" according to the teachings of the present invention.

In FIG. 5, more detailed write "0" operation is illustrated. To write "0", word line 551 is asserted to VDD while bit line 555 keeps the ground level. Diode will be turned on because the forward bias is established from word line (at VDD) to the storage node (at VDD−VF1). After the current path is set up, bit line 555 will go up to high level to write data "0". By raising bit line, the storage node 553 will go up slightly by the coupling as shown in timing sequence 547. After then, the plate line 557 will return to high level. By returning the plate line, the storage node 553 will be coupled up to around 2VDD−VF1. The stored level is less than 2VDD, and higher than VDD. Now the stored level can be redefined as VDD+VR as shown in timing sequence 548. VR is reverse bias from word line 551 when it is activated.

In order to store the charges after writing, the storage capacitor can be ordinary dielectric, such as silicon dioxide, silicon nitride, $Ta_2O_5$, $TiO_2$, $Al_2O_3$, TiN/HfO$_2$/TiN(TIT), and Ru/Insulator/TiN(RIT). However, these capacitors lose the stored charges through leakage path, such that reverse bias leakage reduces the charges to the adjacent nodes and insulator itself has leakage. Hence, periodic refresh is performed to keep the stored data. In addition, ferroelectric capacitor can be used as a storage element, but the memory cell operates is volatile mode, because plate line is not changed for measuring. Retention time would be increased with high dielectric constant.

Figure 6A:
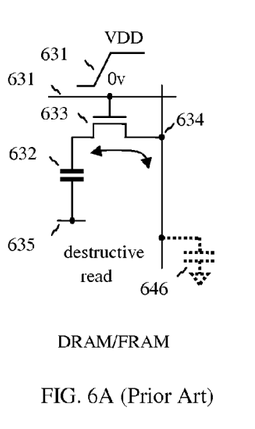
FIG. 6A illustrates the read path as a prior.

In FIG. 6A, the read operation of the prior art is illustrated with the drawing. In the conventional DRAM, the capacitor 632 directly drives bit line 634 which has heavy capacitance. When reading, word line 631 is asserted to VDD, thus the MOS access transistor 633 is turned on, and then the stored charge in the capacitor 632 and the charge 646 in bit line will be redistributed. It makes voltage difference in bit line, and sense amplifier can sense the slight difference of the voltage (for example, around 100 mV) in the bit line and amplify to digital level "1" or "0". After reading data from the storage node, the memory cell should be restored. It is destructive read, which requires the restore procedure for each read cycle in the DRAM.

Figure 6B:
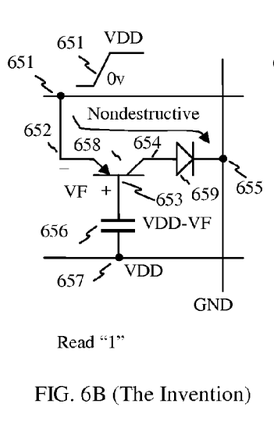
FIG. 6B illustrates the read path for data "1" for the present invention to apply normal dielectric, such as silicon dioxide and silicon nitride.

In FIG. 6B, the read "1" is illustrated for the present invention. The read operation is much simpler than that of write operation with no charge redistribution. To read data "1" which is turn-on diode, word line 651 moves up to high level while bit line 655 stays at ground level and the plate line 657 stays at high level. Raising word line turns on the p-n-p transistor 658 because the storage node 653 is at VDD−VF level, and word line 651 is at VDD, the forward bias (VF) is applied for the emitter 652 (word line) to the base 653 (the storage node). After turning on the p-n-p transistor 658, it will quickly pull up the floating node 654 up to near word line voltage. Consequently, the current path is settled down. Bit line is pulled up slightly. After reading data "1", the storage node 653 is not changed, VDD−VF. This makes nondestructive read.

Figure 6C:
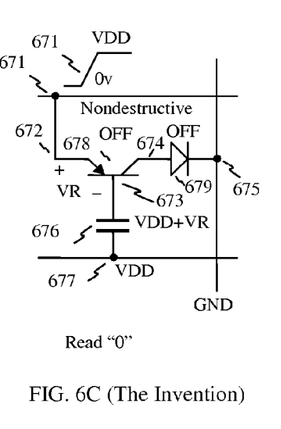
FIG. 6C illustrates the read path for data "0" for the present invention.

In FIG. 6C, the read "0" is illustrated for the present invention. To read data "0" which is turn-off diode, word line 671 moves up to high level while bit line 675 stays at ground level and the plate line 677 stays at high level. Raising word line 671 can not turn on the p-n-p transistor 678 because the storage node 673 is at VDD+VR level, while word line 671 is at VDD, the reverse bias (VR) is applied for the emitter 672 (word line) to the base 673 (the storage node). The p-n-p transistor 678 can not flow any current and can not pull up the floating node 674. Consequently, there is no current path from word line 671 to bit line 675. Bit line stays at ground level. After reading data "0", the storage node 673 is not changed, VDD+VR. This makes nondestructive read as well.

Figure 7A:
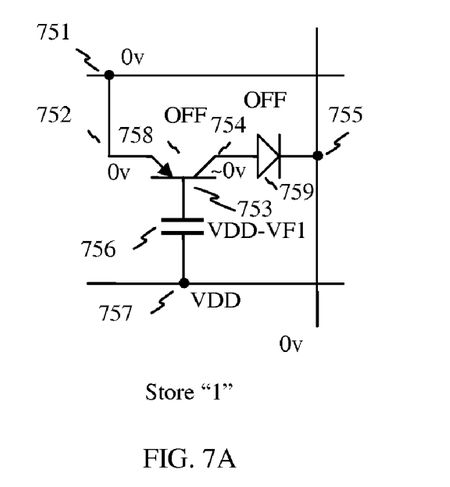
FIG. 7A illustrates the schematic for storing data "1".

In FIG. 7A, the store data "1" is illustrated during standby for the present invention. Word line 751 and bit line 755 stay at ground level, which makes storage node 753 to set up the reverse bias from the adjacent nodes. The stored level is VDD−VF1. The floating node 754 quickly loses its charge toward bit line 755 by the forward bias which will stay at around ground level.

Figure 7B:
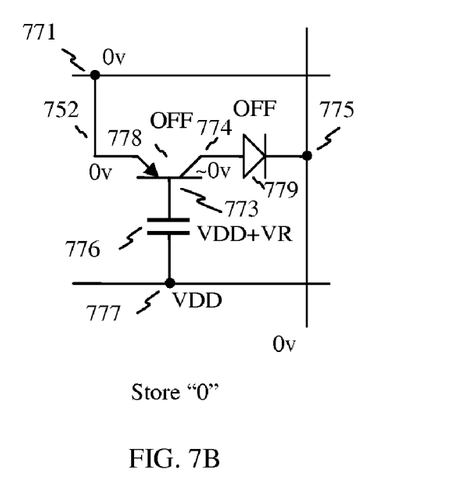
FIG. 7B illustrates the schematic for storing data "0" for the present invention.

In FIG. 7B, the store data "0" is illustrated during standby for the present invention. Word line 771 and bit line 775 stay at ground level, which make storage node 773 to have the reverse bias. The stored level is VDD+VR. The floating node 774 quickly loses its charge by the forward bias toward bit line which is at ground level.

Figure 8A:
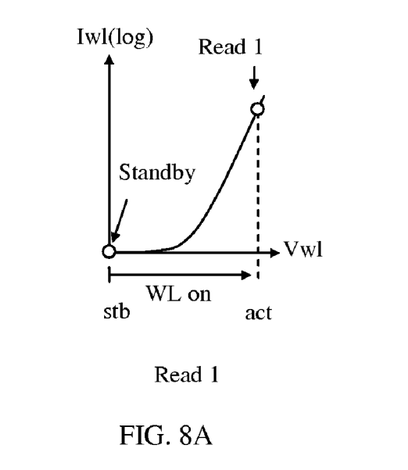
FIG. 8A illustrates I-V curve of the memory cell for read "1"
Figure 8B:
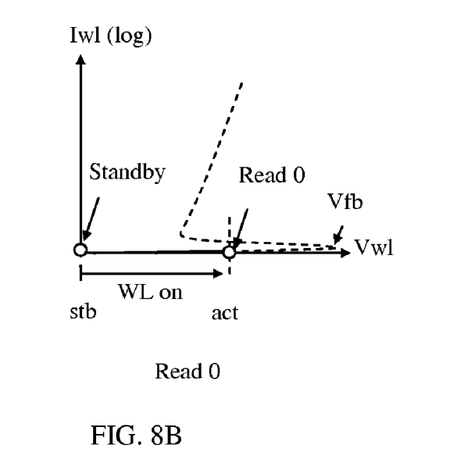
FIG. 8B illustrates I-V curve of the memory cell for read "0", for the present invention.

In FIGS. 8A and 8B, I-V curves are shown for the present invention. During standby, word line voltage (Vwl) is at ground level which does not set up any current flow except oxide leakage. When reading data '1', word line moves to high level and sets up current flow (Iwl) through bit line in FIG. 8A. This means that the storage node is forward bias from word line. When reading data '0', the storage node stays at higher than word line level, which establishes reverse bias for p-n-p transistor. Thus, p-n-p transistor can not flow current, and then the p-n diode can not flow current either with reverse bias. In FIG. 8B, the forward blocking voltage (Vfb) is illustrated when storing data "0", where forward blocking voltage is determined by the plate swing level and storage capacitance which is much higher than VDD.

Figure 9A:
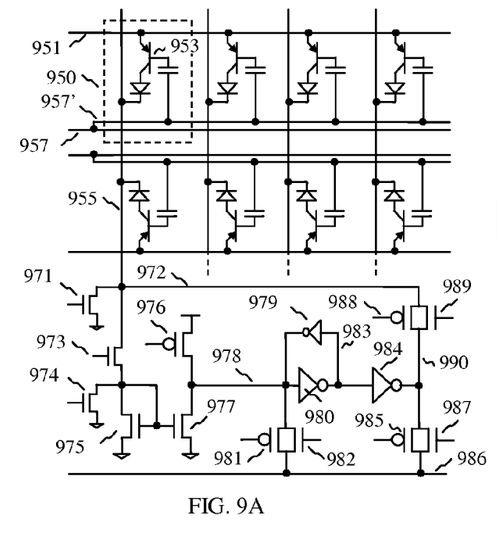
FIG. 9A illustrates an embodiment of memory array based on the present invention, including p-n-p-n diode, storage capacitor and data latch circuit.

In FIG. 9A, read path is illustrated, in order to latch the stored data from the memory cell, as the present invention. The memory cell 950 includes p-n-p-n diode and storage capacitor. When word line 951 is asserted to VDD, the diode is turned on if the storage node 953 is at VDD−VF1 which establishes the forward bias. After the memory cell 950 and the transistor 973 are turned on, the NMOS pull-down 975 flows current and sustains turn-on state through bit line 955. During read, plate line 957 is not changed, the transistor 971, 974 and 976 are turned off. Now the current mirror 977 will flow the amount of current that the memory cell flows, thus the current mirror 977 will change the pre-charged node 978 from high level to ground level because the node 978 was pre-charged to VDD level by the PMOS transistor 976 during pre-charge time. The inverter 979 will resist to changing but the size is so small and then finally the node 978 will be changed by the current mirror 977 to ground. After changing to ground, the state will be sustained by the feedback loop of the two inverters, 979 and 980, which configure two-inverter type latch. And the driver 984 can output the result to data bus 986 through the node 990 when the transmission gate 985 and 987 are turned on. When the stored data is "0", the current mirror 977 is not turned on, thus the latch node voltage is not changed from the pre-charged voltage VDD, because the diode does not flow current, which does not turn on the pull-down NMOS 975. In this manner, the data latch includes pull-down transistor and current mirror, which realizes to latch the data from the memory cell with repeating the diode current. The data latch circuit does not require reference bit line. In contrast, the conventional sense amplifier requires reference bit line and needs waiting time until bit line is fully discharged in order to avoid sensing error. For write operation, the transmission gate 981 and 982, 988 and 989, are turned on.

Figure 9B:
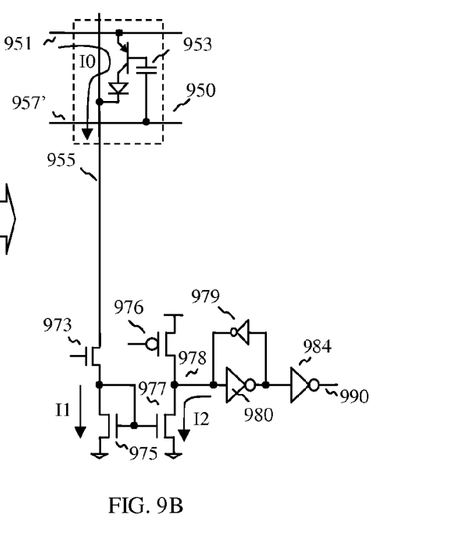
FIG. 9B illustrates the simplified read path from the memory cell to the data latch through bit line relating to FIG. 9A.

In FIG. 9B, the simplified read operation including data latch is illustrated in view of the FIG. 9A. When the stored data is "1", the diode is turned on and flows current I1 through pull-down transistor 975 through bit line 955 and transistor 973, and then the transistor 977 flows the amount of current I2 which can pull down the node 978 to ground from the precharged level VDD. The current I2 will pull down the node 978 and data is stored in the data latch device 979 and 980. After reading data "1", the stored data is not changed in the storage node 953. When reading data "0", the diode is not turned on. When the stored data is "0", the storage node 953 is not changed either, because there was no current flow.

Figure 10:
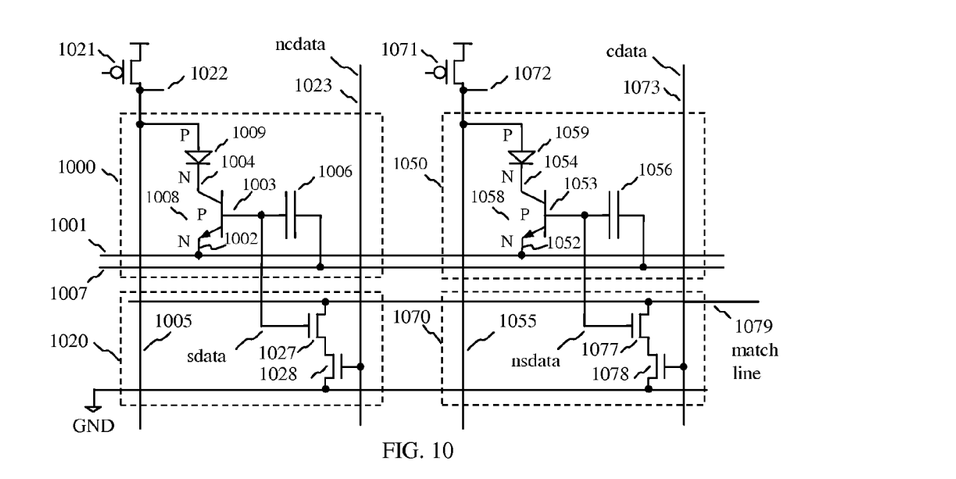
FIG. 10 illustrates an embodiment of CAM array based on the present invention, including n-p-n-p diode and compare circuit.

In FIG. 10, an example embodiment to implement content addressable memory is illustrated as the present invention, wherein the memory cell 1000 and 1050 use diode and capacitor. One advantage of using the diode-based memory is that the storage node can turn on or cut off the match line depending on the stored data, and read-write operation is the same as single port memory as explained above. In the example embodiment in FIG. 10, the memory cell uses n-p-n-p diode which equally works with reverse configuration wherein the signal polarities are reversed as well. When the stored data is "1", the storage node voltage is near VDD. Thus, the storage node turns on the match line, but the storage node cuts off the match line when the stored data is "0" because the storage node voltage is lower than ground level. In doing so, the match operation can be executed with the storage node voltage when the compare circuits are activated, while the memory cells are in standby mode. More detailed operations are explained as below.

There are two storage elements and two compare circuits in a CAM cell. In detail, a CAM is a storage device that is particularly suitable for matching functions because it can be instructed to compare a specific pattern of comparand data with data stored in an associative CAM array. A CAM can include a number of data storage locations, each of which can be accessed by a corresponding address. Functionality of a CAM depends at least in part on whether the CAM includes binary or ternary CAM cells. Ternary CAM cells are mask-per-bit CAM cells that effectively store three states of information, namely a logic "1" state, a logic "0" state, and a don't care state for compare operations. Ternary CAM cells typically include a second memory cell that stores local mask data for the each ternary CAM cell. The local mask data masks the comparison result of the comparand data with the data stored in the first memory cell such that, when the mask bit has a first predetermined value (a logic "0", for example) its compare operation will be masked so that the comparison result does not affect the match line. The ternary CAM cell offers more flexibility to the user to determine on an entry-per-entry basis which bits in a word will be masked during a compare operation. There are prior arts using DRAM, "DRAM based refresh-free ternary CAM", U.S. Pat. No. 6,331,961. And another prior art is shown using negative differential resistance device, "Semiconductor capacitively-coupled negative differential resistance device and its applications in high-density high-speed memories and in power switches", U.S. Pat. No. 6,229,161. But in this prior art, p-n-p-n diode itself (thyristor, or negative differential resistance device) can not be used as a storage element while the present invention uses the p-n-p-n diode as an access device, not storage device because holding current is very high during standby. And conventional SRAM-based CAM is used only for low-density applications. Thus in the present invention, the capacitor memory is used as a CAM application, which realizes high-density and high-speed CAM.

The memory cell 1000 and 1050 store data in storage capacitor 1006 and 1056. The plate 1007 couples to storage node 1003 and 1053 which serve as the bases of n-p-n transistor 1008 and 1058 respectively. The emitter 1002 and 1052 of n-p-n transistors are connected to word line 1001. The collector 1004 of n-p-n 1008 and the collector 1054 of n-p-n 1058 serve as the cathodes of diode 1009 and 1059 respectively. The anode of diode 1009 and 1059 serve as bit line 1005 and 1055 respectively. PMOS pull-up 1021 and 1071 sustain the turn-on state of diode for realizing nondestructive read. Node 1022 and 1072 are bi-directional signal to read or write data. Compare circuit 1020 and 1070 share a match line 1079 which includes series NMOS transistors, 1027 and 1028, 1077 and 1078, where NMOS compare circuit is fast, and n-p-n-p diode is used as access device for the memory cell.

Figure 11:
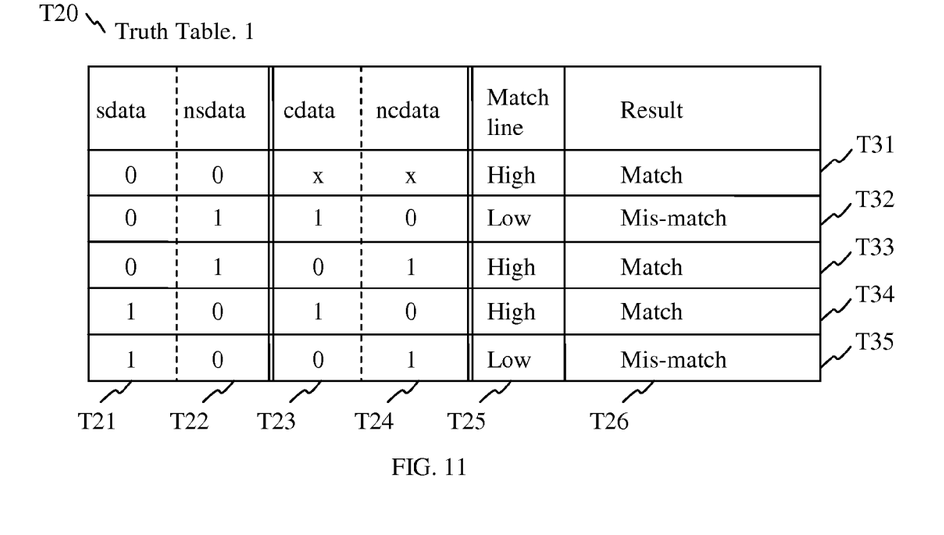
FIG. 11 provides a truth table summarizing the logical relationships among various signals in FIG. 14.

In FIG. 11 in view of FIG. 10, a truth table T20 is shown summarizing the behavior of CAM cell in relation to signal states maintained by various elements within CAM cell in accordance with the present invention. First column T21 lists binary states of "0" and "1" that can be stored in storage node of the capacitor memory cell 1000 in FIG. 10; second column T22 lists binary states of "0" and "1" that can be stored in storage node of the capacitor memory cell 1050 in FIG. 10. Third column T23 lists the ternary states that can be maintained in one of the complement compare data lines, namely cdata which is the signal 1073 in FIG. 10. Fourth column T24 lists the ternary states that can be maintained in the other complement compare data line, namely ncdata which is the signal 1023 in FIG. 10. Fifth column T25 lists "high" and "low" as the two available voltage levels for match line 1079. Finally, sixth column T26 lists "match" and "mismatch" as the two possible results for comparing states of ncdata line 1023 and cdata line 1073 with the states of CAM cell.

Continuing with FIG. 11 in view of FIG. 10, row T31 indicates masked case where sdata 1003 and nsdata 1053 are "0", which makes match line to stay the pre-charge level, regardless of the compare data because sdata and nsdata turn off MOS transistor 1027 and 1077, rows T32-T33 both indicate that "0" state of CAM cell is represented by "0" of capacitor memory cell 1000, and "1" of capacitor memory cell 1050. In row T32, because state "1" of cdata line 1073 does not match state "0" of CAM cell, match line 1079 is driven "low" to indicate a mismatch of the data key and the stored value (state "0") of CAM cell. In row T33, because state "0" of cdata line 1073 matches state "0" of CAM cell, match line 1079 is driven "high to indicate a partial match of the comparand and the stored value (state "0") of CAM.

Continuing still with FIG. 11 in view of FIG. 10, rows T34-T35 both indicate that "1" state of CAM cell is represented by "1" of capacitor memory cell 1000 and "0" of capacitor cell 1050. In row T34, because state "1" of cdata line 1073 matches state "1" of CAM cell, match line 1079 is driven "high to indicate a partial match of the comparand and the stored value (state "1") of CAM cell. In row T35, because state "0" of cdata line 1073 does not match state "1" of CAM cell, match line 1079 is driven "low" to indicate a mismatch of the comparand and the stored value (state "1") of CAM cell.

Methods of Fabrication

Replacing MOS access transistor with a diode access device, the memory cell needs only a p-n-p-n diode (or n-p-n-p diode) and a capacitor storage element, which realize various types of memory cell structure, in order to fabricate on the bulk or SOI (Silicon-on-Insulator) wafer. The steps in the process flow should be compatible with the current CMOS manufacturing environment, which are reported as the prior arts, such as U.S. Pat. No. 6,104,045, No. 6,229,161, No. 6,940,761, No. 6,943,083, and No. 7,042,027. In this respect, there is no need of describing too much detailed process flow to form the memory cell, such as width, length, thickness, temperature, forming method or any other material related data. Instead of describing those details, the present invention focuses on illustrating the new memory cell structures which are practical and mass producible.

Figures 12A, 12B:
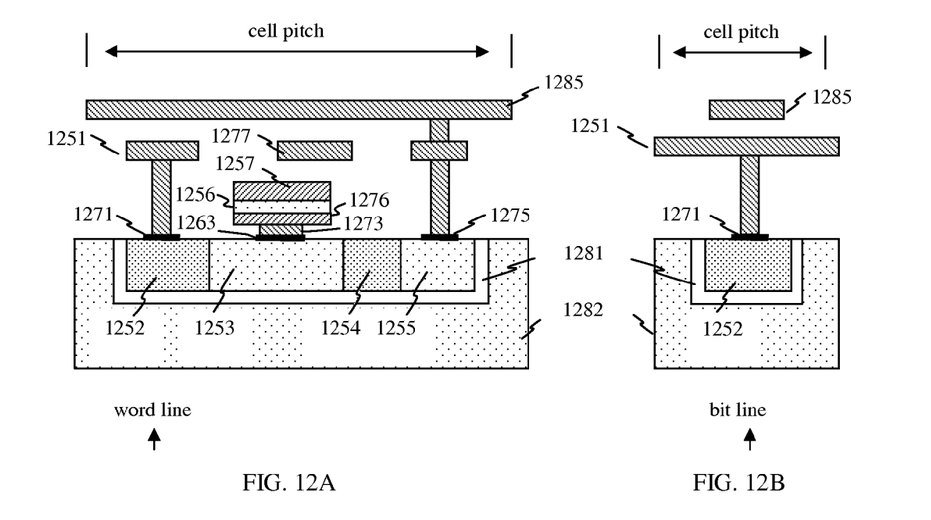
FIGS. 12A and 12B illustrate the cross sectional views of one embodiment for the present invention on the bulk wafer. 12A is shown from word line direction, and 12B is shown from bit line direction.

FIG. 12A outlines one embodiment of fabrication technique for the present invention, wherein the memory cell is formed inside of a trench area on the bulk, where word line 1251 is connected to p-type region 1252 through the ohmic contact region 1271 which can reduce contact resistance, p-type region 1252 is attached to n-type region 1253 which is connected to the first plate of the capacitor 1276 through the contact region 1263 and conduction layer 1273, and the insulator 1256 can be ordinary dielectric capacitor or ferroelectric capacitor. The second plate of capacitor 1257 is connected to the plate line 1277 outside of memory array (not shown) to reduce resistance. And n-type region 1253 is attached to p-type region 1254, p-type region 1254 is attached to n-type region 1255, n-type region 1255 is attached to bit line 1285 through conduction and contact region 1275. The second plate of capacitor 1257 only couples to the first plate of the capacitor 1276 where the second plate 1257 has no coupling region to p-type region 1252 and p-type region 1254. In doing so, there is no leakage to adjacent nodes when the second plate swings from ground level to high level to write. The memory cell is isolated from the well region 1282 by the isolation layer 1281. FIG. 12B shows bit line direction of the memory cell, where the cell is formed inside of trench area adding isolation layer 1281 on the bulk.

This configuration removes complicated MOS device from the memory cell, as a result, the memory cell has a capacitor and a diode, which is simple to fabricate and analyze as long as the reverse bias leakage and the leakage of the insulator are controllable. The storage node 1276 and 1253 should be sustained for long time but there is one more leakage path, so-called back channel effect in the planar p-n-p-n structure of wafer shown in FIG. 12A. Related references are disclosed, Chen et al, "Characterization of back-channel subthreshold conduction of walled SOI devices", IEEE Transactions on electron Devices, Vol. 38, No. 12, pp 2722, December 1991, and Shin et al, "Leakage current models of thin film silicon-on-insulator devices", Applied Physics Letters, Vol. 72, No. 10, March 1998. The parasitic NMOS transistor wherein the source/drain is n-type region 1253, the body is p-type region 1254, and the other source/drain is n-type region 1255, and the well region 1282 serves as the gate. However, in the present invention, the insulator 1281 between the diode and the substrate is enough thick to remove back channel effect because the insulator 1281 is grown only for the memory cell while the thin gate oxide will be grown only for MOS transistor (not shown). In doing so, back channel effect is avoided.

Figure 13A:
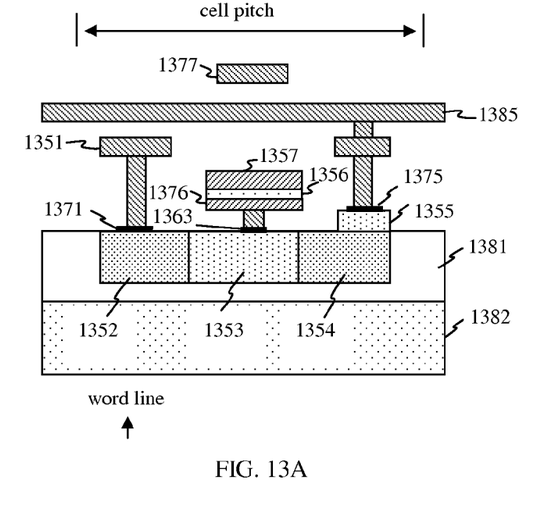
FIGS. 13A and 13B illustrate the cross sectional views of one vertical embodiment for the present invention. 13A is shown from word line direction, and 13B is shown from bit line direction.

FIG. 13A outlines one embodiment of fabrication technique on the wafer for the present invention, wherein word line 1351 is connected to p-type region 1352 through contact region 1371, p-type region 1352 is attached to n-type region 1353 which is connected to the storage node 1376 through contact region 1363 and conduction layer, the insulator 1356 can be can be ordinary dielectric capacitor or ferroelectric capacitor. The second plate of capacitor 1357 couples to the storage node 1376. And n-type region 1353 is attached to p-type region 1354, p-type region 1354 is attached to n-type region 1355 which is vertically attached to the upper side of p-type region 1354, n-type region 1355 is connected to bit line 1385 through contact region 1375 and conduction layer. The second plate of capacitor 1357 only couples to the first plate of capacitor 1376.

Figure 13B:
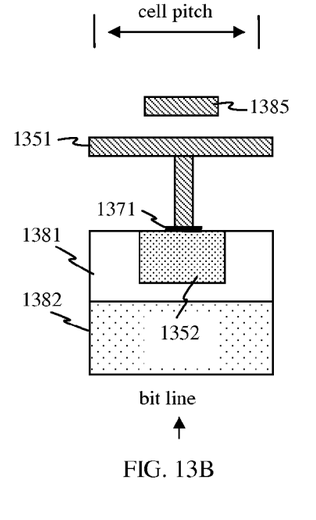

In this structure, the back channel effect is removed wherein n-type region 1355 is at the upper side of p-type 1354 which can be a body for back channel effect. Thus there is no parasitic NMOS transistor with vertical structure. FIG. 13A shows word line direction of the memory cell. FIG. 13B shows bit line direction of the memory cell, where the cell is formed on the wafer. The memory cell is isolated from the substrate or well region 1382 by the insulator 1381.

Figure 14A:
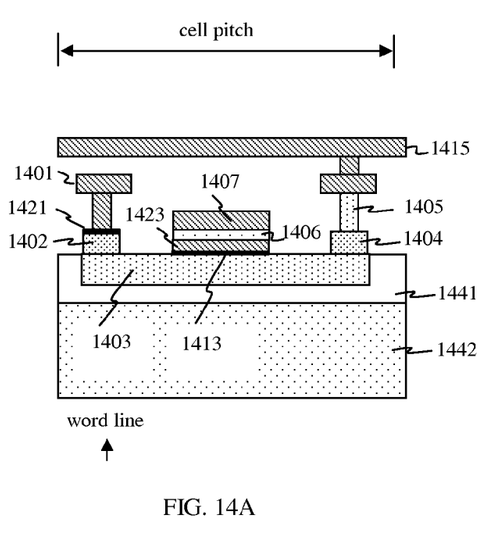
FIG. 14A illustrates the cross sectional views of one vertical embodiment for the present invention, which is shown from word line direction.

FIG. 14A outlines one embodiment of fabrication technique for the present invention, which memory cell is isolated from the wafer 1442 by the insulator 1441, wherein word line 1401 is connected to p-type region 1402 through contact region 1421, p-type region 1402 is attached to n-type region 1403 which is connected to the storage node 1423 through the buffer layer (contact layer) 1413, the insulator 1406 includes dielectric material. And n-type region 1403 is attached to p-type region 1404, p-type region 1404 is attached to n-type region 1405 which is vertically attached to the upper side of p-type region 1404, n-type region 1405 is connected to bit line 1415. The second plate of capacitor 1407 only couples to the first plate of the capacitor 1423. In this embodiment, the parasitic NMOS transistor is removed as well. In addition, one of the alternative embodiments can be available, such that metal-semiconductor diode is used for the region 1405. The leakage of this diode between p-type 1404 and metal 1405 does not matter for storing data because p-type region 1404 is floating and does not have any data, where data is stored in the storage node 1423. There is a related reference to fabricate metal-semiconductor diode with CMOS process, Sankaran et al, "Schottky barrier diodes for millimeter wave detection in a foundry CMOS process", IEEE Electron Device Letters, Vol. 26, No. 7, pp 492-494, July 2005. Moreover, the present invention can use various type of metal to form metal-semiconductor diode, such as Al, Cu, Au, Pt and so on. Moreover, the diode can be formed by various types of semiconductor, such as silicon, germanium, GaAs, SiGe and others, as long as reverse bias leakage is controllable.

Figure 14B:
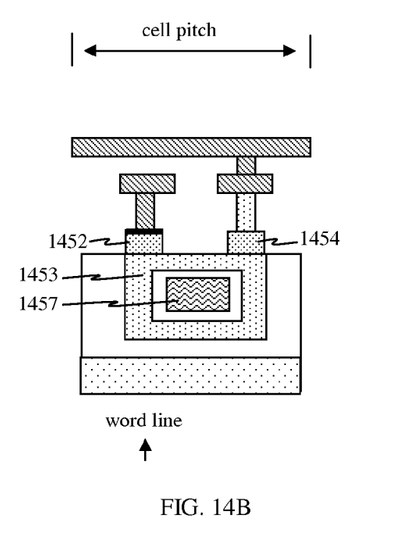
FIG. 14B illustrates the cross sectional views of one vertical embodiment for the present invention on the bulk wafer, which is shown from word line direction.

In FIG. 14B, there is more alternative embodiment for configuring memory, wherein the second plate 1457 is surrounded, like a donut shape, by the insulator and n-type region 1453. This memory can reduce cell area. Furthermore, the length of the base region 1453 from the p-type region 1452 to p-type region 1454 is effectively reduced which makes to flow more current when the diode is turned on. FIG. 14B shows word line direction of the memory cell.

Figure 15A:
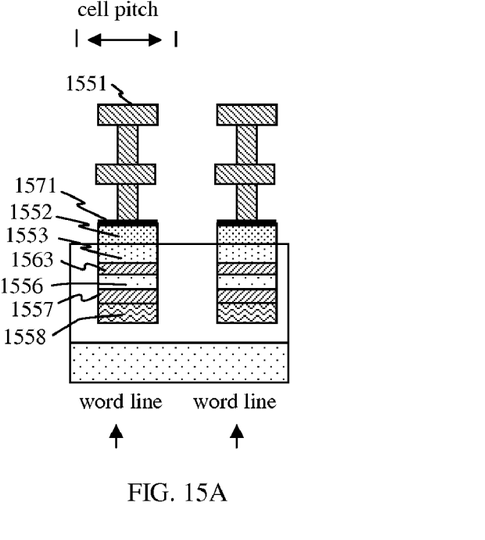
FIGS. 15A and 15B illustrate the cross sectional views of one vertical embodiment on the bulk or SOI wafer, according to the teachings of the present invention. 15A is shown from word line direction and 15B is shown from bit line direction.
Figure 15B:
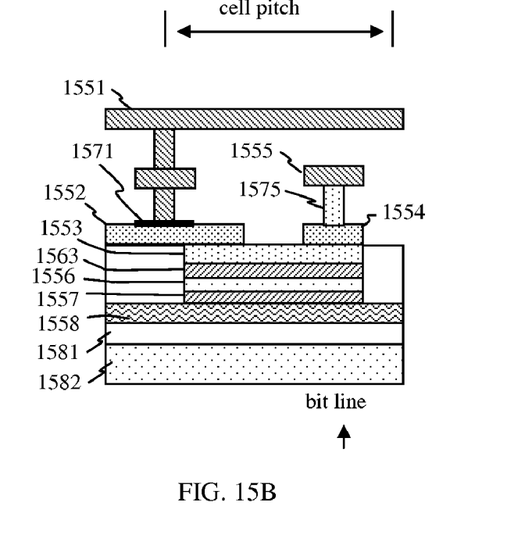

FIGS. 15A and 15B outline one embodiment of fabrication technique to place the plate 1558 in the bottom, wherein word line 1551 is connected to p-type region 1552 through contact region 1571, p-type region 1552 is attached to n-type region 1553 which is on the lower side of p-type region 1552 and is attached to the upper side of the first plate 1563. The p-type region 1554 is attached to the upper side of the n-type region 1553, as shown in FIG. 15B, and the n-type region 1575 is attached to the upper side of the p-type region 1554. The n-type region 1575 is connected to bit line 1555. Alternatively, the region 1575 can be metal to form metal-semiconductor diode. The memory cell is isolated from the well or substrate region 1582 by insulator 1581. FIG. 15A shows word line direction of the memory cell, and FIG. 15B shows bit line direction of the memory cell.

Figures 16A, 16B:
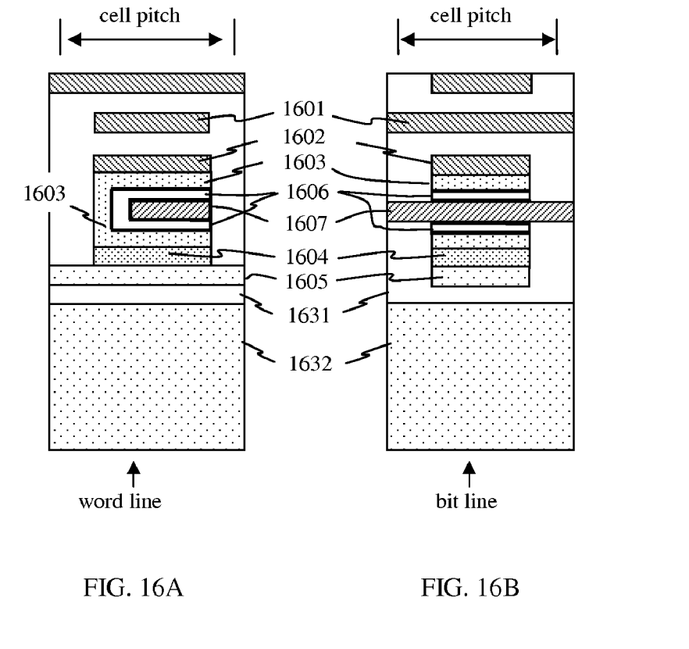
FIGS. 16A and 16B illustrate the cross sectional views of fully vertical embodiment for the present invention on the bulk or SOI wafer. 16A is shown from word line direction and 16B is shown from bit line direction.

FIG. 16A outlines fully vertical embodiment of fabrication technique to reduce cell area on the bulk or SOI wafer, wherein word line 1601 is connected to p-type region 1602 outside of array area (not shown) to reduce sheet resistance, region 1602 is attached to n-type region 1603, the plate 1607 is partially surrounded by insulator 1606 and n-type region 1603, n-type region 1603 is attached to p-type region 1604, p-type region 1604 is attached to n-type region which is bit line 1605 in the bottom, wherein bit line uses n-type semiconductor. FIG. 16B shows the cross sectional view seen from word line direction, and FIG. 16B shows the cross sectional view seen from bit line direction. And the memory cell is isolated from the wafer 1632 by the insulator 1631.

Figure 17:
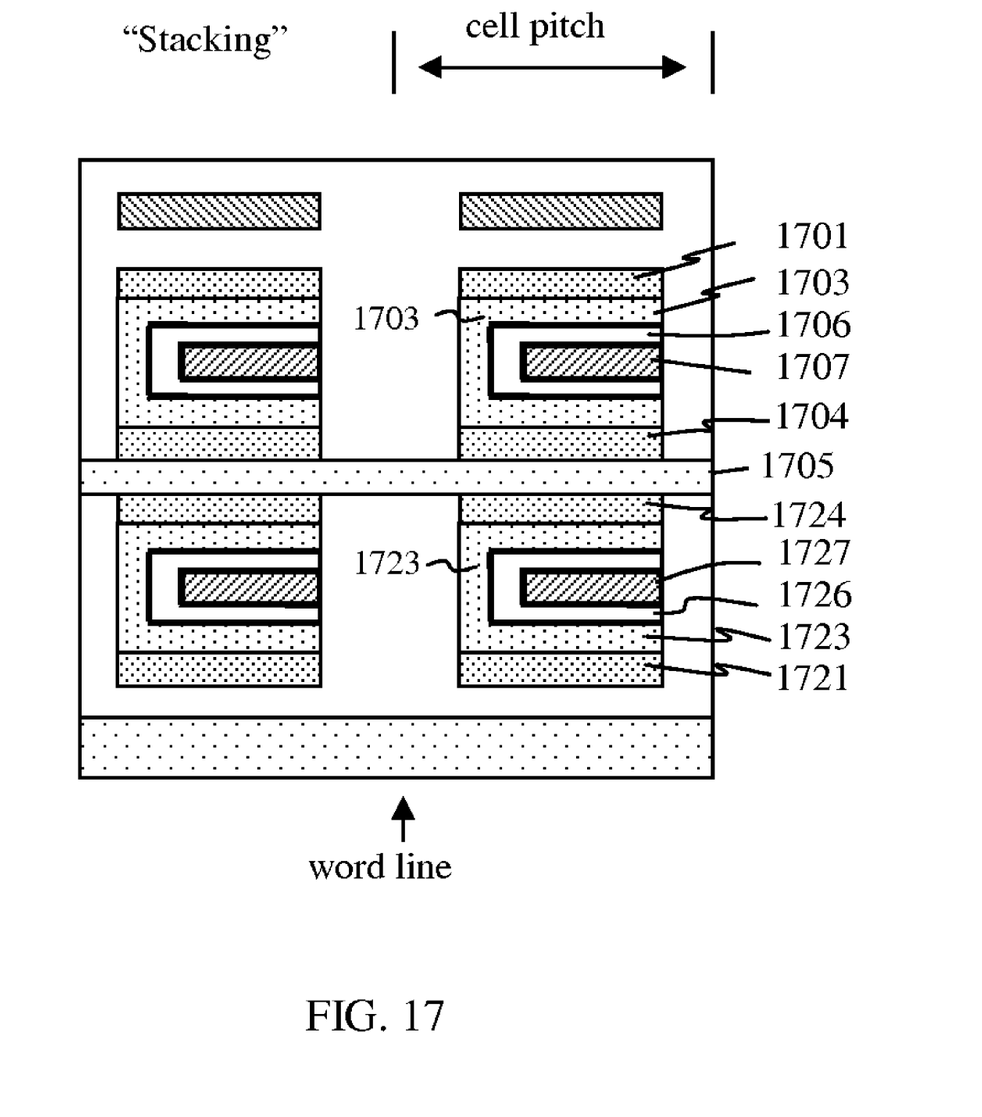
FIG. 17 illustrates the cross sectional views of stacked embodiment, wherein plate line is partially enclosed by the storage node. It is shown from word line direction.

FIG. 17 illustrates stacked type of embodiment, wherein two vertical cells are vertically formed on the wafer. Upper memory cell is formed on the lower cell, such that p-type region 1701 serves as word line and it is attached to n-type region 1703, the plate 1707 is partially surrounded by insulator 1706 and n-type region 1703, n-type region 1703 is attached to p-type region 1704, p-type region 1704 is attached to bit line 1705, wherein bit line uses n-type semiconductor. Lower memory cell is formed on the wafer, such that p-type region 1721 serves as word line and it is attached to n-type region 1723, the plate 1727 is partially surrounded by insulator 1726 and n-type region 1723, n-type region 1723 is attached to p-type region 1724, p-type region 1724 is attached to bit line 1705. FIG. 17 shows the cross sectional view seen from word line direction. This vertically stacked memory cell can reduce area dramatically.

While the description here has been given for configuring the memory circuit and structure, alternative embodiments would work equally well with reverse connection such that first terminal is n-type and serves as word line, second terminal is p-type and serves as storage node, third terminal is n-type and floating, and fourth terminal is p-type and serves as bit line, and the plate of capacitor couples storage node which plate has no coupling region to first, third and fourth terminal. Word line and bit line will swing from high level to ground level to read or write, and return to high level. The plate line will swing from ground level to high level to read or write, and return to ground level.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A random access memory, comprising:

capacitor as a storage element, wherein is formed by an insulator(s) between a first plate and a second plate; and diode as an access device, wherein includes four terminals, a first terminal is p-type, a second terminal is n-type, a third terminal is p-type, a fourth terminal is n-type, the first terminal is connected to a word line, the second terminal is connected to the first plate of the capacitor which serves as a storage node, the third terminal is floating, and the fourth terminal is connected to a bit line to write or read data; and plate line is connected to the second plate of the capacitor which couples to the first plate of the capacitor, and the word line is turned off to cut holding current of the diode during standby; and write sequence, wherein the word line is raised to high level first, and then the plate line is lowered to ground level to clear previous data, then the bit line is asserted, after then the plate line is returned to high level, but the storage node is not coupled by returning the plate line because the diode is in on state when write data is logic high, otherwise the storage node is coupled to higher than logic high level because the diode is in off state when the write data is logic low, after then the word line is de-asserted to ground level, and finally the bit line is de-asserted to ground level; and read sequence, wherein the word line is asserted to high level first, which enables the diode to detect the storage node voltage whether it is forward bias or not, thus the diode is turned on when stored data is logic high otherwise it is not turned on when the stored data is logic low, and then the diode transfers charges to a data latch when the stored data is logic high, otherwise it does not when the stored data is logic low; and data latch including pull-down transistor, current mirror and two inverter-type latch, wherein the pull-down transistor is turned on by the diode when the stored data is logic high, at the same time the current mirror repeats the current and changes latch node from a pre-charge state, after then the latch node is sustained by the latch which the latch node becomes input of first inverter, and it is also connected to output of second inverter, and input of second inverter is output of first inverter, otherwise the current mirror does not flow current when the stored data is logic low, when read.

2. The random access memory of claim 1, wherein the first terminal is n-type, the second terminal is p-type, the third terminal is n-type, the fourth terminal is p-type.

3. The random access memory of claim 2, wherein includes data latch having pull-up transistor, current mirror and two-inverter type latch, which stores binary states from the memory cell depending on the states of diode, turn-on or turn-off, when read.

4. The random access memory of claim 1, wherein includes insulator, such as silicon dioxide, silicon nitride, $Ta_2O_5$, $TiO_2$, $Al_2O_3$, $TiN/HfO_2/TiN(TIT)$, and $Ru/Insulator/TiN(RIT)$.

5. The random access memory of claim 1, wherein includes ferroelectric dielectric, such as lead zirconate titanate (PZT), lead lanthanum zirconium titanate (PLZT), barium strontium titanate (BST), and strontium bismuth tantalate (SBT).

6. The random access memory of claim 1, wherein is formed from silicon diode, germanium diode, or compound semiconductor diode.

7. The random access memory of claim 1, wherein the fourth terminal uses metal to form metal-semiconductor diode.

8. The random access memory of claim 1, wherein word line is repeatedly connected to metal shunting lines outside of memory array, in order to reduce sheet resistance.

9. The random access memory of claim 1, wherein at least one of the terminals is attached to adjacent terminal vertically, such that word line is connected to the upper side of first terminal through contact layer, first terminal is attached to the upper side of second terminal, third terminal is attached to the upper side of second terminal, fourth terminal is attached to the upper side of third terminal, the storage capacitor is formed in on the bottom of diode between the first plate and the second plate by the insulator, the first plate of the capacitor is attached to a lower side of second terminal.

10. The random access memory of claim 1, wherein word line is connected to the upper side of first terminal through contact layer, first terminal is attached to the upper side of second terminal, second terminal fully or partially surrounds plate to form capacitor with insulator, second terminal is attached to the upper side of third terminal, and third terminal is attached to the upper side of fourth terminal in the bottom.

11. The random access memory of claim 1, wherein two memory cells are stacked, and share fourth terminal.

12. The random access memory of claim 1, wherein is formed on the bulk of the wafer.

13. The random access memory of claim 1, wherein is formed on the SOI wafer.

* * * * *